United States Patent [19]

Nakamura

[11] 4,007,432
[45] Feb. 8, 1977

[54] ELECTRO-MECHANICAL FILTER HAVING A PLURALITY OF TUNING FORKS

[75] Inventor: Junpei Nakamura, Tokyo, Japan

[73] Assignee: Kabushiki Kaisha Daini Seikosha, Japan

[22] Filed: Aug. 28, 1975

[21] Appl. No.: 608,689

[30] Foreign Application Priority Data

Aug. 29, 1974 Japan .................... 49-103673[U]

[52] U.S. Cl. .................................. 333/71; 310/8.2; 310/8.6; 333/72
[51] Int. Cl.² ...................... H03H 9/04; H03H 9/26
[58] Field of Search ............ 333/71, 72; 310/8, 8.5, 310/8.6, 25, 8.2; 58/23 TF; 331/116 R, 116 M, 156; 84/409, 457

[56] References Cited

UNITED STATES PATENTS

| | | | |
|---|---|---|---|
| 3,106,124 | 10/1963 | Asten | 310/25 X |
| 3,659,230 | 4/1972 | Tanaka et al. | 333/71 |

Primary Examiner—Alfred E. Smith
Assistant Examiner—Marvin Nussbaum
Attorney, Agent, or Firm—Robert E. Burns; Emmanuel J. Lobato; Bruce L. Adams

[57] ABSTRACT

An electro-mechanical filter is configured from a single thin metal sheet and comprises a base portion, at least four vibratory tines extending outwardly from the base portion, and a plurality of supporting members also extending outwardly from the base portion. The tines and supporting members are arranged circumferentially around the base portion in alternate relationship and extend from the base portion in parallel with each other. The tines may extend in either the same or the opposite direction as the supporting members. A piezoelectric element is coupled to each tine and the elements are differentially connected together to form a filter.

8 Claims, 11 Drawing Figures

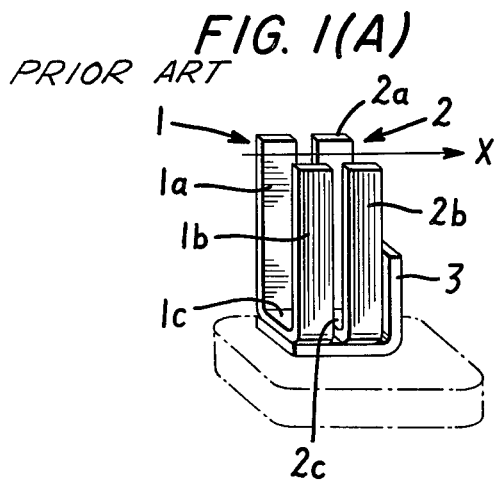
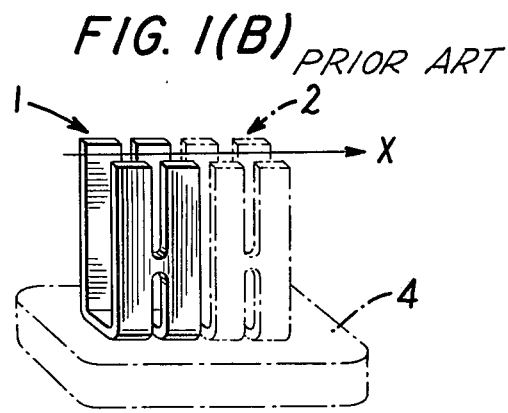
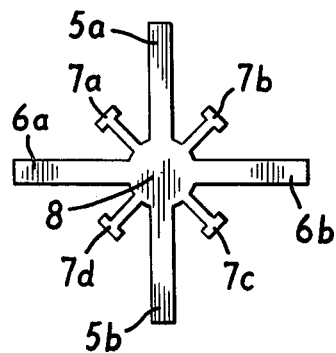
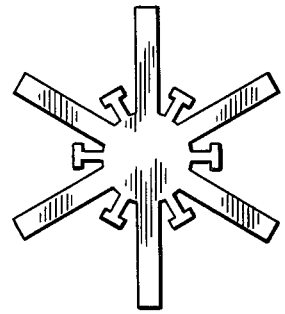
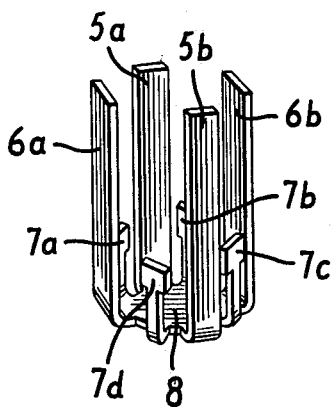
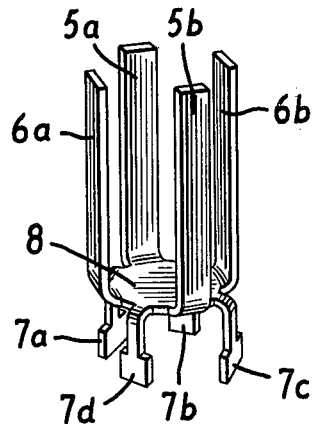
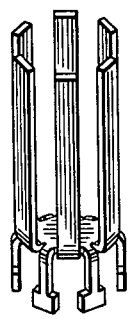

ELECTRO-MECHANICAL FILTER HAVING A PLURALITY OF TUNING FORKS

BACKGROUND OF THE INVENTION

This invention relates to an electro-mechanical filter having a plurality of tuning forks, and more particularly relates to an electro-mechanical filter having a plurality of tines disposed around the perimeter of the base plate instead of being disposed in a line configuration.

Conventionally, there are many kinds of band pass filters which are made of tuning forks having close center frequencies. For example, some of these electro-mechanical filters are shown in FIG. 1.

In FIG. 1(A), plural tuning forks are made by mechanical cutting or milling. Tuning forks 1 and 2 having tines 1a, 1b and 2a, 2b are fixed in a linear row to a supporting member 3 respectively by spot welding at the base plates 1c and 2c.

Another band pass filter of duplex tuning fork configuration is shown in FIG. 1(B). Tuning forks 1 and 2 are pressed out from a sheet of thin metal plate by a pressing machine, and then the flat tuning fork blanks are formed into tuning forks by bending. Then these tuning forks are fixed in a linear row to a supporting member 4.

In these conventional filters, the plurality of tuning forks are aligned linearly in the direction of the arrow X so that a relatively long space is needed in the horizontal direction in order to contain the tuning forks.

Because of this, these electro-mechanical filters are not available for circuit elements which must be minimized in size.

SUMMARY OF THE INVENTION

Therefore, this invention is directed to overcome the above defects and the primary object of this invention is to minimize the over all size of a band pass filter thereby saving the interior space of the device with which it is used.

Another object of the invention is to provide a band pass filter which is easy to manufacture and assemble.

According to this invention, a common base plate, tines and supporting members are simultaneously cut out from a sheet of thin metal plate by a pressing machine to form a filter bank which is formed into a filter by bending said tines and supporting members. Because of this, since the manufacturing process is shortened, it is easy to assemble the filters at low cost.

The foregoing object and other objects as well as the characteristic features of the invention will become more apparent and more readily understandable by the following description and the appended claims when read in conjunction with the accompanying drawings.

BRIEF DESCRIPTION OF THE DRAWINGS

FIG. 1(A) and (B) show conventional prior art type filter units,

FIG. 2(A) and (B) show filter blanks which are formed into the filter units according to this invention, FIG. 3(A) and (B) show embodiments of filter units according to this invention, FIG. 4 shows another embodiment of this invention, FIG. 5(A) and (B) schematically show circuit connections of the filter units.

DETAILED DESCRIPTION OF THE INVENTION

Referring to FIG. 2(A), a filter unit blank is shown which has two pairs of vibratory tines 5a, 5b and 6a, 6b, four supporting member 7a–7d and a common base plate portion 8. The filter unit blank has a planar shape and is pressed out from a thin metal plate.

The tines and supporting members extend radilly outwardly from the base plate 8 and are disposed circumferentially around the plate perimeter. Preferably, this metal plate is formed from a constant elastic alloy containing Fe, Ni, Cr, etc. of whose temperature coefficient is excellent. Another type of filter unit blank is shown in FIG. 2(B) and is made in the same way.

The only difference between the blanks of FIG. 2(A) and (B) is the number of tines and supporting members.

The filter unit blanks are formed to a filter unit by bending the tines and supporting members. Supporting members 7a–7d, may be bent in the same direction as the tines (FIG. 3(A)), or may be bent in the opposite direction as the tines (FIG. 3(B)). This bending direction may be freely selected depending upon the type connection to be made to other components. In either case, the tines and supporting members extend in directions parallel to a given directional axis which extends normal or perpendicular to the base plate 8.

FIG. 4 shows a filter unit corresponding to the blank of FIG. 2(B) and which has three tuning forks.

Figure 5A:
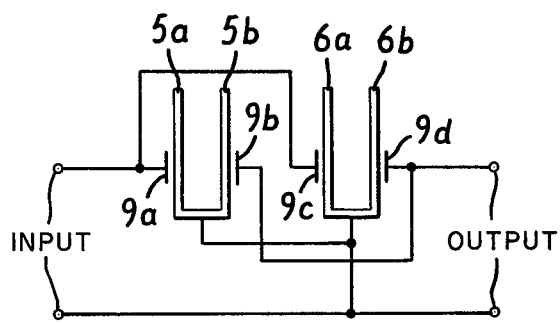
Figure 5B:
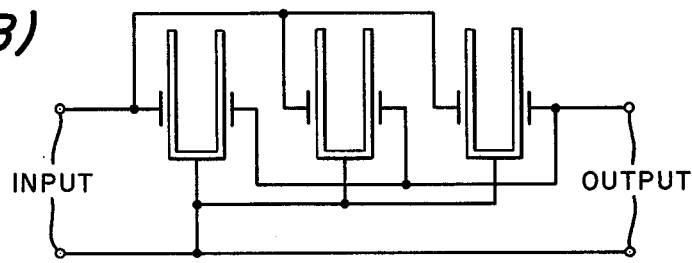

FIG. 5 schematically shows circuit connections of the filter units, (A) is for the filter units shown in FIG. 3 and (B) is for the filter units shown in FIG. 4. Piezoelectric elements 9a–9d, for example, barium titanate ceramics, are coupled or adhered on the tines near the node point.

Each piezo-electric element is connected differentially and the filter circuit is completed as shown in FIG. 5. The phase difference between input and output signals is "zero" in one tuning fork and is "$\pi$" in the other tuning fork. These two tuning forks are connected in parallel.

Figure 6:
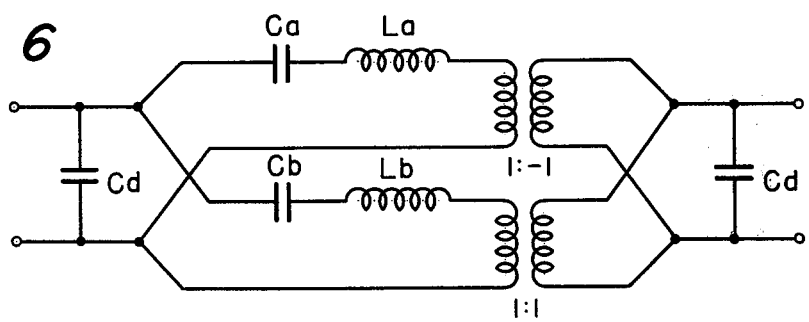
FIG. 6 shows an equivalent circuit to that of FIG. 5(A)
Figure 7:
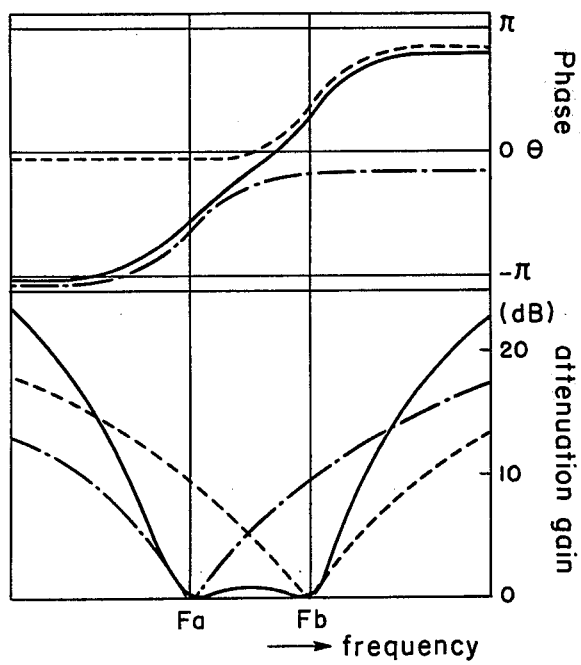
FIG. 7 shows the transmission characteristics of a tuning fork type filter which is connected differentially.

FIG. 6 shows the equivalent circuit of FIG. 5(A) and FIG. 7 shows the transmission characteristics of the filter.

Assuming that the center frequencies of respective tuning forks are Fa and Fb, the corresponding phase characteristics and attenuation characteristics are shown on the same graph.

Since the output gains of both tuning forks are compensated with respect to each other at regions less than the frequency Fa and more than the frequency Fb, the attenuation gain is increased. On the other hand, since the output gain of both tuning forks is emphasized with respect to each other between the frequency range of Fa to Fb, a wideband filter having a steep cut-off frequency characteristic is available (shown by a solid line).

It is needless to say that a filter unit having three tuning forks may be constructed in the same way, and that the addition of more tuning forks improves the transmission characteristics.

While a preferred embodiment of the invention has been shown and described it will be understood that many modifications and changes can be made within the true spirit and scope of the invention.

I claim:

1. An electro-mechanical filter comprising: a single thin metal sheet configured into a filter having a base portion, at least four vibratory tines connected in circumferentially spaced relationship around said base portion and extending outwardly therefrom in a direction parallel to a given directional axis, and a plurality of supporting members connected to said base portion and extending outwardly therefrom in a direction parallel to said given directional axis.

2. An electro-mechanical filter according to claim 1; wherein said supporting members are disposed in circumferentially spaced relationship around said base portion.

3. An electro-mechanical filter according to claim 2; wherein each of said supporting members is connected to said base portion intermediate two of said tines.

4. An electro-mechanical filter according to claim 2; wherein said tines and supporting members extend in the same direction from said base portion.

5. An electro-mechanical filter according to claim 2; wherein said tines and supporting members extend in opposite directions from said base portion.

6. An electro-mechanical filter according to claim 2; further including a piezo-electric element coupled to each of said tines.

7. An electro-mechanical filter according to claim 6; further including means connecting together said piezo-electric elements in a differential circuit arrangement.

8. An electro-mechanical filter according to claim 2; wherein said base portion has a circular shape and said tines and supporting members extend outwardly therefrom in directions normal thereto.

* * * * *